(12) United States Patent
Kokatsu

(10) Patent No.: US 8,467,762 B2
(45) Date of Patent: Jun. 18, 2013

(54) FREQUENCY CONVERTING DEVICE, TELEVISION DEVICE AND FREQUENCY CONVERTING METHOD

(75) Inventor: Hideyuki Kokatsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 13/051,513

(22) Filed: Mar. 18, 2011

(65) Prior Publication Data
US 2012/0052831 A1 Mar. 1, 2012

(30) Foreign Application Priority Data
Aug. 27, 2010 (JP) .................................. 2010-191153

(51) Int. Cl.
*H04B 1/26* (2006.01)
*H04B 1/30* (2006.01)

(52) U.S. Cl.
CPC .................................... *H04B 1/30* (2013.01)
USPC ............................ 455/313; 455/317; 455/323

(58) Field of Classification Search
USPC ............. 455/180.1, 182.1, 182.2, 182.3, 313, 455/314, 315, 317, 318, 323, 324
See application file for complete search history.

(56) References Cited

U.S. PATENT DOCUMENTS

| 7,392,026 B2 * | 6/2008 | Alam et al. ................. 455/180.1 |
| 2004/0198297 A1 * | 10/2004 | Oh et al. ....................... 455/318 |
| 2006/0116098 A1 * | 6/2006 | Oba et al. ..................... 455/313 |
| 2010/0003943 A1 | 1/2010 | Seendripu et al. |

FOREIGN PATENT DOCUMENTS

| JP | 08125447 | 5/1996 |
| JP | 2003298356 | 10/2003 |

* cited by examiner

*Primary Examiner* — Thanh Le
(74) *Attorney, Agent, or Firm* — Turocy & Watson, LLP

(57) ABSTRACT

According to an embodiment, a frequency converting device is provided with a duty adjusting unit that generates a 1/N local signal, which is a local signal with a duty ratio of 1/N, when N is an integral number not smaller than 3 and an N-th high-frequency component included in the local signal is a target of inhibition. Further, this is provided with a mixer that outputs difference or sum between/of the 1/N local signal and an input signal.

3 Claims, 5 Drawing Sheets

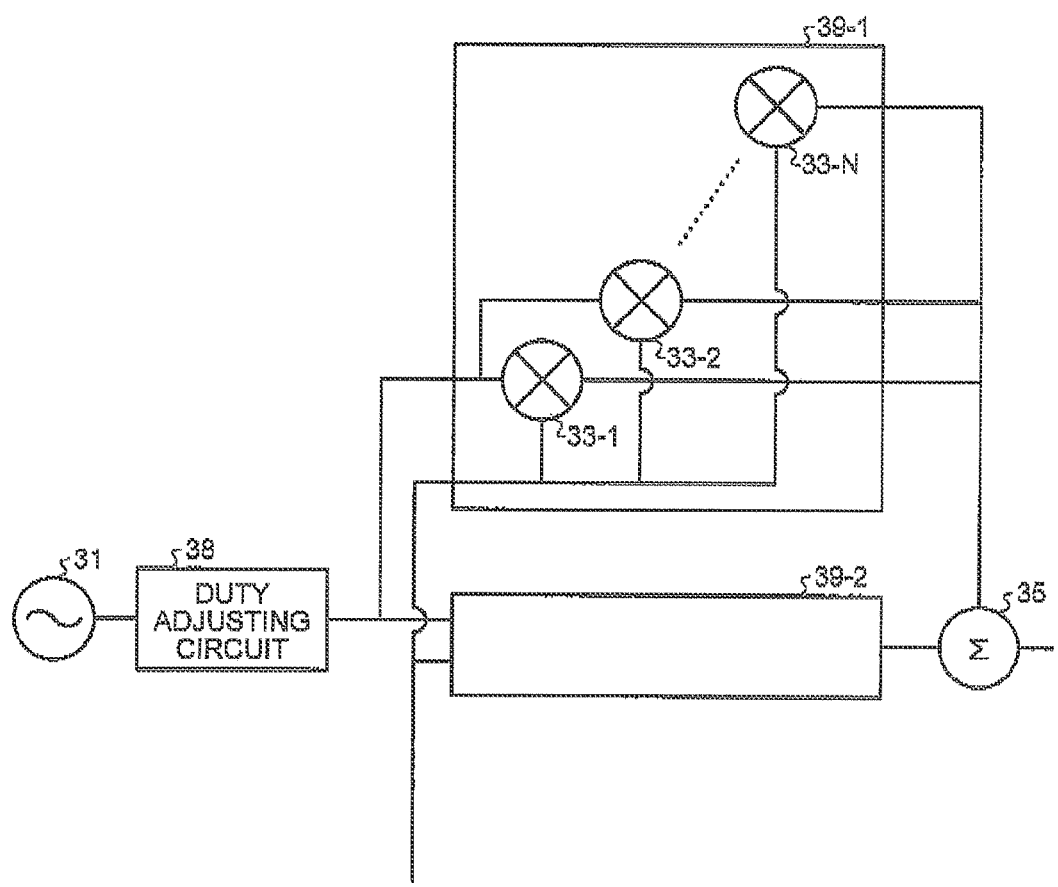

FREQUENCY CONVERTING DEVICE, TELEVISION DEVICE AND FREQUENCY CONVERTING METHOD

CROSS-REFERENCE TO RELATED APPLICATIONS

This application is based upon and claims the benefit of priority from the prior Japanese Patent Application No. 2010-191153, filed on Aug. 27, 2010; the entire contents of which are incorporated herein by reference.

FIELD

Embodiments generally relate to a frequency converting device, a television device, and a frequency converting method.

BACKGROUND

A mixer circuit used for a tuner integrated circuit (IC) for television (TV) and the like that frequency-converts an input signal is generally provided with an input signal port, an output signal port, and a local signal port. The mixer circuit outputs a signal having a frequency, which is difference or sum between/of a frequency (input frequency) of a signal (for example, a received TV broadcast signal) input from the input signal port and a frequency (local frequency) of a local signal input from the local signal port from the output port.

In general, the local signal includes not only a desired frequency (local frequency) but also a harmonic component. In the above-described mixer circuit, the input signal also couples to the harmonic. Therefore, the output signal also includes a signal in which the input signal couples to the harmonic to be frequency-converted.

When it is required to equally receive a frequency signal of a wideband as when receiving the TV broadcast, in the mixer circuit, it is required that the mixer does not respond to the harmonic component of the local signal.

A reason for this is hereinafter described by a specific example. For example, when a received frequency range is from 45 MHz to 1000 MHz, an electric wave of this wide frequency range is equally input to the mixer circuit. At that time, when a direct conversion system in which the input frequency and the local frequency are equal to each other and the output signal is a base band signal is used, the mixer circuit frequency-converts the input signal of which input frequency is 100 MHz using the local signal of 100 MHZ to output as the base band signal centered around 0 Hz. However, since the frequency range of the input signal is wide, an interfering wave of 300 MHz three times as high as the local frequency of 100 MHz is also input to the mixer circuit as the input signal, for example, to be coupled to a third harmonic (300 MHz) of the local frequency and is frequency-converted to a frequency band around 0 Hz as a desired base band signal. As a result, poor reception occurs.

BRIEF DESCRIPTION OF THE DRAWINGS

FIG. 10 is a view of a functional configuration example of the frequency converting device according to a fourth embodiment.

DETAILED DESCRIPTION

According to an embodiment, a frequency converting device is provided with a duty adjusting unit that generates a 1/N local signal, which is the local signal with a duty ratio of 1/N, when N is an integral number not smaller than 3 and an N-th high-frequency component included in the local signal is a target of inhibition. Further, this is provided with a mixer that outputs difference or sum between/of the 1/N local signal and an input signal.

The frequency converting device, a television device, and a frequency converting method according to the embodiment are hereinafter described in detail with reference to the attached drawings. Meanwhile, the present invention is not limited by the embodiments.

First Embodiment

Figure 1:
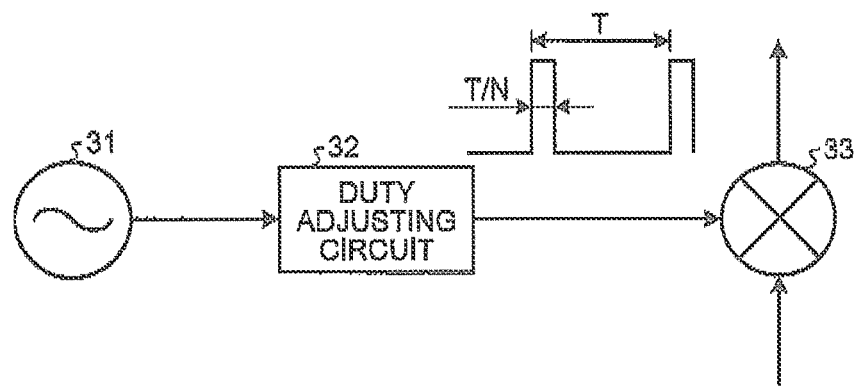
FIG. 1 is a view of a functional configuration example of a frequency converting device according to a first embodiment.

FIG. 1 is a view of a functional configuration example of the frequency converting device according to a first embodiment. As illustrated in FIG. 1, the frequency converting device of this embodiment is composed of an oscillator 31 that generates the local signal having a predetermined local frequency, a duty adjusting circuit 32 that adjust a duty of the local signal, and a mixer 33 that frequency-converts the input signal to a base band signal using the local signal.

In a conventional frequency converting device, the local signal is generated as the signal with the duty of ½, in general. That is to say, when one period of the local signal is set to T, a pulse width of the local signal is T/2. In this case, a local signal f(t) may be expanded using Fourier series expansion as expressed by a following equation (1). Meanwhile, $\omega_0$ represents an angular speed ($\omega_0 = 2\pi/T$) corresponding to the local frequency and t represents a time.

$$f(t) = \frac{4}{\pi}\left[\sin\omega_0 t - \frac{1}{3}\sin 3\omega_0 t + \frac{1}{5}\sin 5\omega_0 t + \ldots\right] \quad (1)$$

Second and third terms of the equation (1) represent third and fifth harmonics (waves with frequencies three times and five times as high as the local frequency, respectively). In the conventional frequency converting device, when there is a harmonic component of the local frequency as represented by the second and third terms of the equation (1), a signal generated by coupling of the harmonic component and the input signal (a signal obtained by frequency-converting the input signal by the harmonic component) is included in an output signal after frequency conversion. The signal generated by the coupling of the harmonic component and the input signal (hereinafter, referred to as a high-order output signal) is present in a region of a desired base band signal when the input signal has a frequency component about the same as the harmonic component, and this causes deterioration in receiving sensitivity.

In this embodiment, the duty adjusting circuit 32 adjusts the duty of the local signal to 1/N (N is an integral number not smaller than 3), thereby decreasing the high-order output signal generated by the harmonic component with a frequency N times as high as the local frequency included in the local signal (hereinafter, referred to as an N-th local signal). In other words, in this embodiment, sensitivity of the frequency converting device to an N-th local signal is suppressed.

For example, when an effect by a third local signal is suppressed, the duty adjusting circuit 32 sets the duty of the local signal to ⅓. At that time, the local signal f(t) may be expressed by a following equation (2).

$$f(t) = \frac{2}{3} + \left(\frac{\sqrt{3}}{2\pi}\cos\omega_0 t + \frac{1}{2\pi}\sin\omega_0 t\right) + \left(-\frac{\sqrt{3}}{4\pi}\cos 2\omega_0 t + \frac{3}{4\pi}\sin 2\omega_0 t\right) + \quad (2)$$

$$(0) + \left(-\frac{\sqrt{3}}{8\pi}\cos 4\omega_0 t + \frac{3}{4\pi}\sin 4\omega_0 t\right) + \ldots$$

As is clear from the equation (2), there is not a frequency component three times as high as the local frequency (third harmonic component: a term including $3\omega_0 t$) in the local signal. Therefore, when using the local signal with the duty of ⅓, the effect by the third local signal (the high-order output signal by the coupling of the third local signal and the input signal) may be suppressed.

Next, by generalizing this, it is described that the local signal with the duty of 1/N does not include a component corresponding to the N-th harmonic. A periodic function f(t) of the period T may be expanded using the Fourier series expansion as expressed by a following equation (3).

$$f(t) = \frac{a_0}{2} + \sum_{n=1}^{\infty}\left[a_n\cos\frac{2n\pi}{T}t + b_n\sin\frac{2n\pi}{T}t\right] \quad (3)$$

$$a_n = \frac{2}{T}\int_{-\frac{T}{2}}^{\frac{T}{2}} f(t)\cos\frac{2n\pi}{T}t\,dt$$

$$b_n = \frac{2}{T}\int_{-\frac{T}{2}}^{\frac{T}{2}} f(t)\sin\frac{2n\pi}{T}t\,dt$$

Coefficients $a_n$ and $b_n$ in the above-described equation (3) represent the coefficients of the n-th harmonic. Herein, when f(t) is a waveform with the duty of 1/N, f(t) may be expressed by a following equation (4) in a section from −T/2 to T/2.

$$f(t) = \begin{cases} 0 & -\frac{T}{2} < t < 0 \\ 1 & 0 < t < \frac{T}{N} \\ 0 & \frac{T}{N} < t < \frac{T}{2} \end{cases} \quad (4)$$

A following equation (5) is obtained by the equations (3) and (4).

$$\begin{aligned}
a_n &= \frac{2}{T}\int_{-\frac{T}{2}}^{\frac{T}{2}} f(t)\cos\frac{2n\pi}{T}t\,dt & b_n &= \frac{2}{T}\int_{-\frac{T}{2}}^{\frac{T}{2}} f(t)\sin\frac{2n\pi}{T}t\,dt \\
&= \frac{2}{T}\int_0^{\frac{T}{N}}\cos\frac{2n\pi}{T}t\,dt & &= \frac{2}{T}\int_0^{\frac{T}{N}}\sin\frac{2n\pi}{T}t\,dt \\
&= \frac{2}{T}\cdot\frac{T}{2n\pi}\left[\sin\frac{2n\pi}{T}t\right]_0^{\frac{T}{N}} & &= \frac{2}{T}\cdot\frac{T}{2n\pi}\left[-\cos\frac{2n\pi}{T}t\right]_0^{\frac{T}{N}} \\
&= \frac{1}{n\pi}\sin\frac{2n\pi}{N} & &= \frac{1}{n\pi}\left[1-\cos\frac{2n\pi}{N}\right]
\end{aligned} \quad (5)$$

Therefore, when n=N in the equation (5), both of $a_n$ and $b_n$ are 0. As described above, the local signal with the duty of 1/N does not include the component corresponding to the N-th harmonic. A result obtained by confirming this effect by simulation is hereinafter described.

First, in a model in which a conventional switching mixer is simplified, the input signal including an interfering wave (third-order harmonic wave) having a frequency component three times as high as that of a desired wave (D wave) is input and the duty of the local signal is set to ½ in a conventional manner. In a specific simulation circuit example, third-order interference outputs −28.13 dBm.

On the other hand, when the duty of the local signal is set to ⅓ and another condition is made similar to that of the above-described conventional switching mixer, the interfering wave of −82.29 dBm is generated in the output signal by the simulation (the signal after the frequency conversion). Therefore, when there is the third-order harmonic wave, improvement of 54.16 dB is expected by setting the duty of ½ to the duty of ⅓.

Figure 2:
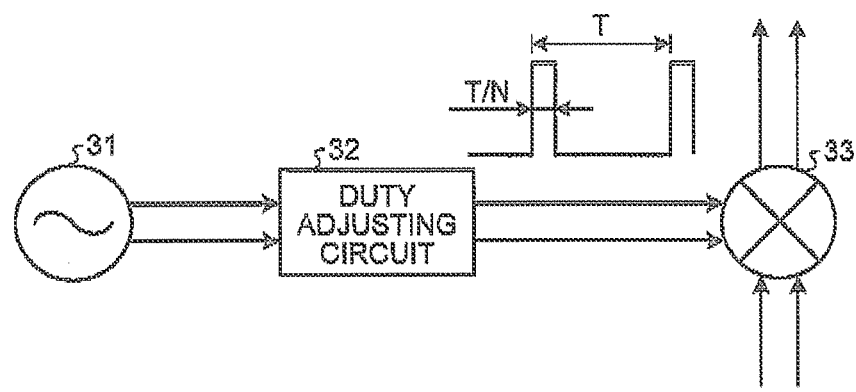
FIG. 2 is a view of a functional configuration example of the frequency converting device of the first embodiment when a differential signal is input.

The frequency converting device of this embodiment may be applied also when a differential signal is input. FIG. 2 is a view of a functional configuration example of the frequency converting device of this embodiment when the differential signal is input. The frequency converting device illustrated in FIG. 2 is similar to the frequency converting device in FIG. 1 except that the input signal is the differential signal, the local signal is differentiated, and the output signal is the differential signal. In this case, the duty adjusting circuit 32 adjusts to set the duty of the differentiated local signal to 1/N.

Although the frequency converting device of this embodiment may be used as an LSI for TV tuner for receiving TV broadcast, for example, there is not a limitation, and this may also be used as the frequency converting device of another application as far as this is a device that frequency-converts the input signal using the local signal such as the frequency converting device in a communication device that receives a wideband signal. Although a case in which the input signal is converted to the base band frequency is described in this embodiment, in a case in which the input signal is converted to an intermediate frequency and the like also, an N-th frequency of the local signal may be suppressed by similarly setting the duty of the local signal to 1/N.

Figure 3:
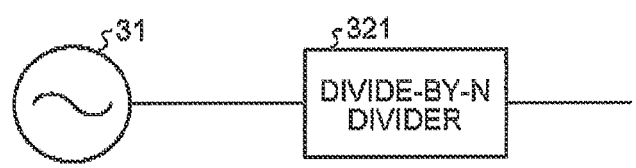
FIG. 3 is a view of a configuration example of a duty adjusting circuit when a divide-by-N divider is used.

Next, a configuration example of the duty adjusting circuit 32 of the frequency converting device of this embodiment is described. FIG. 3 is a view of the configuration example of the duty adjusting circuit 32 when a divide-by-N divider 321 is used as the duty adjusting circuit 32. Although an example in which the differential signal is not used is illustrated in FIG. 3, when using the differential signal, an output from the oscillator 31 and an output from the divide-by-N divider 321 are made the differential signals. Meanwhile, the configuration of the duty adjusting circuit 32 is not limited to this and any configuration is possible.

Figure 4:
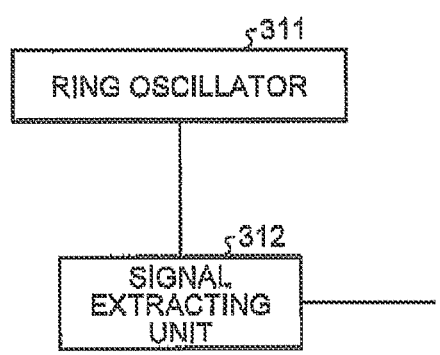
FIG. 4 is a view of a configuration example of an oscillator provided with a function as the duty adjusting circuit.

It is also possible that the oscillator 31 is provided with a function as the duty adjusting circuit 32. In other words, the duty adjusting circuit 32 has a function of the oscillator 31. FIG. 4 is a view of a configuration example of the oscillator provided with the function as the duty adjusting circuit 32. The oscillator in FIG. 4 is provided with a ring oscillator 311 obtained by connecting N differential amplifiers in series in a ring manner, and a signal extracting unit 312 that selects a signal to be output as a clock signal out of outputs from the differential amplifiers, which compose the ring oscillator. The signal extracting unit 312 appropriately selects the output of the differential amplifier, thereby generating the local signal with the duty of 1/N. Meanwhile, the oscillator provided with the function as the duty adjusting circuit 32 is not limited to the example in FIG. 4 and may be realized by any configuration. When using the oscillator provided with the function as the duty adjusting circuit 32, it is not required that the duty adjusting circuit 32 is provided.

Meanwhile, although the frequency converting device is provided with the oscillator 31 in this embodiment, it is also possible to use a frequency signal input from outside as the local signal without the oscillator 31 being provided. In this case, the duty adjusting circuit 32 may generate the local signal with the duty of 1/N using the frequency signal input from outside.

Figure 5:
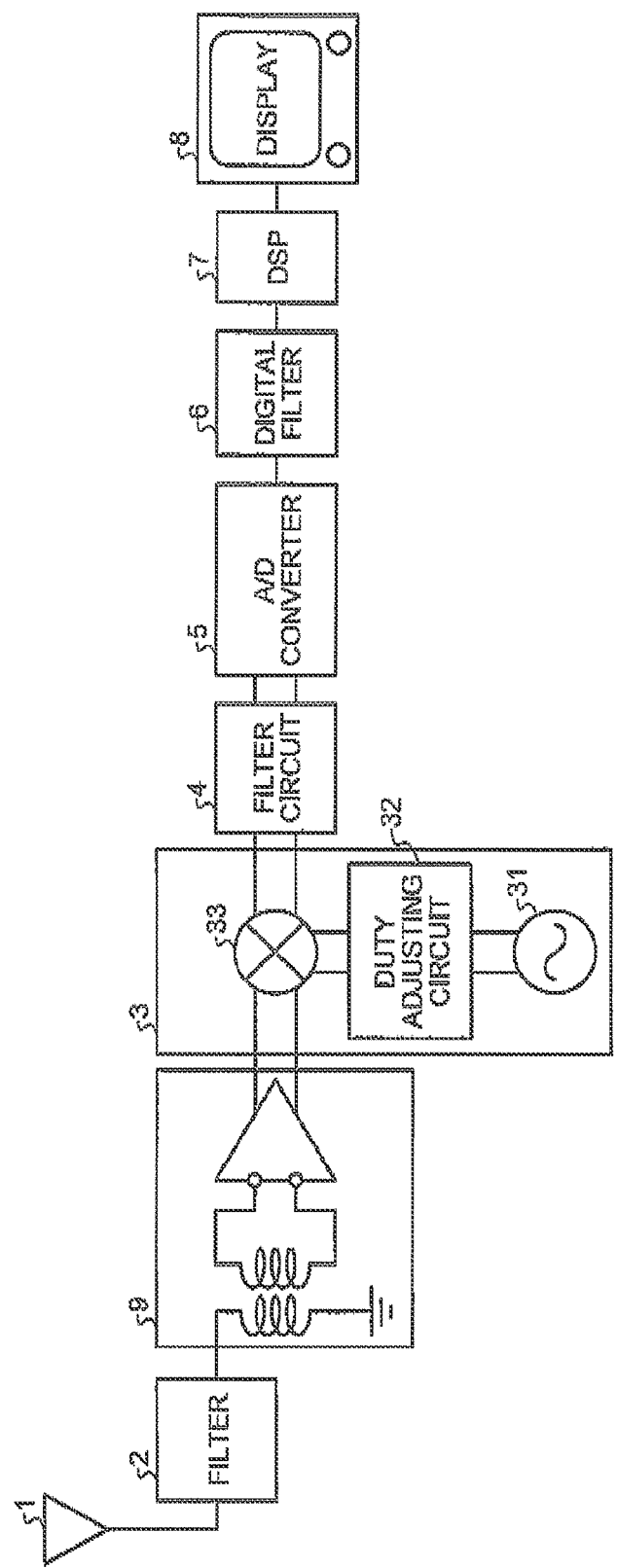
FIG. 5 is a view of a configuration example of a television device provided with an LSI for TV tuner being the frequency converting device of the first embodiment.

FIG. 5 is a view of a configuration example of the television device provided with the LSI for TV tuner, which is the frequency converting device of this embodiment. As illustrated in FIG. 5, the television device of this embodiment is composed of an antenna 1, a differentiating unit 9, a filter 2, an LSI for TV tuner 3, a filter circuit 4, an analog/digital (A/D) converter 5, a digital filter 6, a digital signal processor (DSP) 7, and a display 8. Meanwhile, although an example in which the frequency converting device of this embodiment is used in the television device including also the display 8 is herein illustrated, the frequency converting device of this embodiment may be used as a receiving device that receives the TV broadcast. In this case, the receiving device is composed of the antenna 1, the differentiating unit 2, the LSI for TV tuner 3, the filter circuit 4, the A/D converter 5, the digital filter 6, and the DSP 7, for example.

Meanwhile, FIG. 5 is merely an example and the frequency converting device of this embodiment may be used as the LSI for TV tuner of the television device or the receiving device other than the configuration example illustrated in FIG. 5.

Operation of the television device illustrated in FIG. 5 is described. First, the antenna 1 receives a TV broadcast signal and the differentiating unit 9 differentiates the TV broadcast signal. The filter 2 removes an electric wave out of a desired frequency band (TV frequency band) from the differentiated TV broadcast signal. Then, the LSI for TV tuner 3 frequency-converts the TV broadcast signal to the base band signal using the local signal with the duty of 1/N as described above. Thereafter, the filter circuit 4 performs a filtering process from the base band signal to the base band signal and the A/D converter 5 converts the base band signal after the filtering process from an analog signal to a digital signal. Next, the digital filter 6 performs the filtering process to the digital signal and the DSP 7 performs a predetermined process to the digital signal after the filtering process to output to the display 8 as a TV image signal. That is to say, the DSP 7 has a function as an image processor. Then, the display 8 displays the TV image signal as a TV image.

Meanwhile, although an example in which the input signal (TV broadcast signal) is differentiated is illustrated in FIG. 5, it is not required that the input signal is differentiated. When this is not differentiated, it is not required that the differentiating unit 9 is provided.

As described above, in this embodiment, it is configured that the duty adjusting circuit 32 generates the local signal with the duty of 1/N and the mixer 33 frequency-converts the input signal using the local signal. Therefore, the N-th high-frequency component of the local signal may be suppressed. Therefore, generation of the interfering wave generated by the N-th high-frequency component may be decreased and deterioration in the receiving sensitivity is prevented.

Second Embodiment

Figure 6:
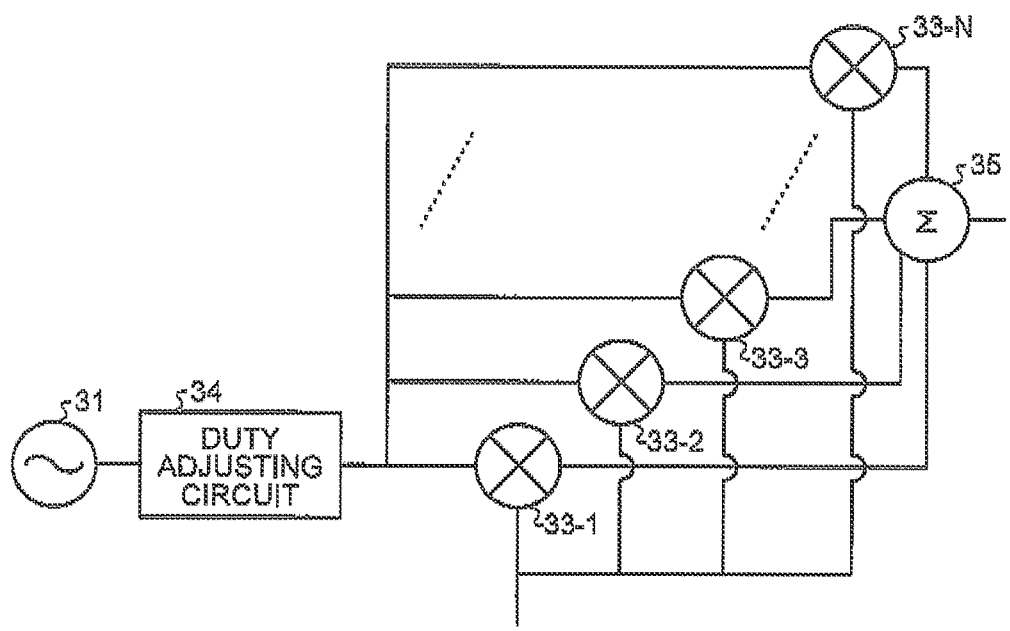
FIG. 6 is a view of a functional configuration example of the frequency converting device according to a second embodiment.

FIG. 6 is a view of a functional configuration example of the frequency converting device according to a second embodiment. The frequency converting device of this embodiment is composed of the oscillator 31, a duty adjusting circuit 34, mixers 33-1 to 33-N (N is the integral number not smaller than 3), and an adder 35. A reference numeral identical to that of the first embodiment is assigned to a component having a similar function as that of the first embodiment and an overlapping description is omitted. Hereinafter, a point different from that of the first embodiment is described.

In this embodiment, the duty adjusting circuit 34 generates N local signals with the duty of 1/N of which phases are different from each other and inputs them to the mixers 33-1 to 33-N, respectively. A function of each of the mixers 33-1 to 33-N is similar to that of the mixer 33 of the first embodiment. The mixers 33-1 to 33-N frequency-convert the input signal (for example, the TV broadcast signal) based on the input local signal and output the signals after the frequency conversion to the adder 35. The adder 35 adds up the N signals output from the mixers 33-1 to 33-N to output.

Figure 7:
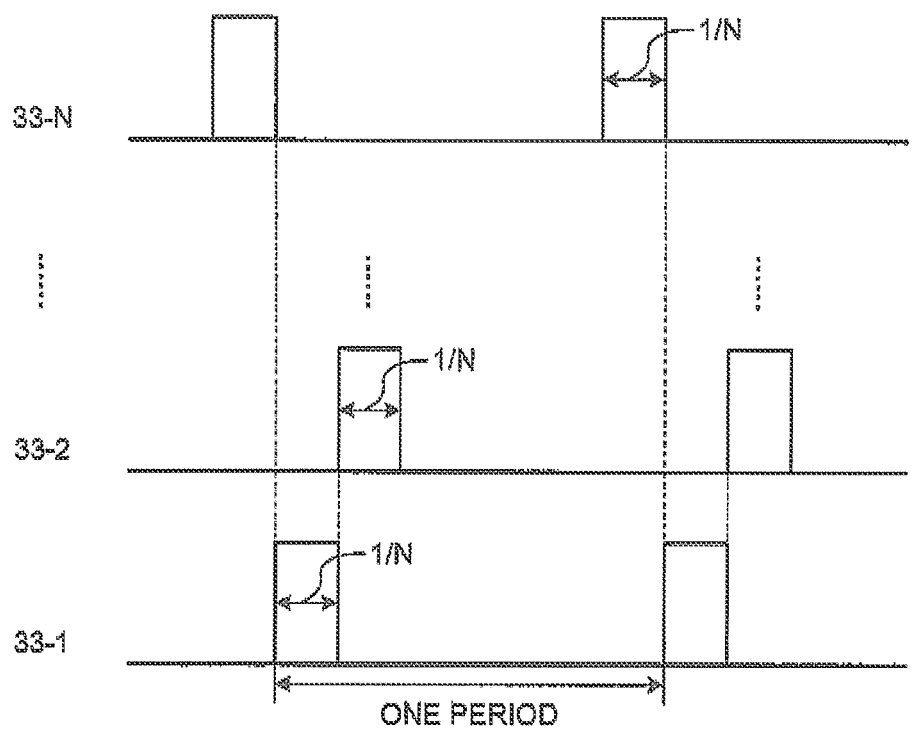
FIG. 7 is a view of an example of a local signal with a duty of 1/N generated by the duty adjusting circuit of the second embodiment.

FIG. 7 is a view of an example of the local signal with the duty of 1/N generated by the duty adjusting circuit 34 of this embodiment. The duty adjusting circuit 34 of this embodiment generates N local signals to be input to the mixers 33-1 to 33-N, respectively. The duty of each of the generated local signals is 1/N, and they are generated such that the phases of which are shifted from each other by $2\pi/N$. For example, the local signal to be input to the lowest mixer 33-1 in FIG. 7 and the local signal to be input to the second lowest mixer 33-2 in FIG. 7 are shifted from each other by 1/N of one period (T/N). The duty adjusting circuit 34 of this embodiment generates the local signals of which phases are sequentially shifted from each other by $2\pi/N$ in this manner.

Operation of this embodiment other than the above-description is similar to that of the first embodiment. Also, the differential signal may be used as in the case illustrated in FIG. 2 of the first embodiment also in the frequency converting device of this embodiment. Also, as described in the first embodiment, the oscillator 31 may also have the function of the duty adjusting circuit 34.

As described in the first embodiment, when performing the frequency conversion using the local signal with the duty of 1/N, the N-th harmonic of the local signal may be suppressed; however, noise property might be decreased than in the case in which the duty is ½. This is because a switching rate increases and the like as the duty becomes smaller. On the other hand, in this embodiment, the noise property may be improved by adding up the local signals of which phases are shifted from each other.

Meanwhile, although the N mixers are provided to generate the N local signals with the duty of 1/N in this embodiment, it is also possible that N2 (N2≠N, N2 is an integral number not smaller than 2) mixers are provided to generate N2 local signals with the duty of 1/N. Then, the local signals with the duty of 1/N of which phases are different from each other by $2\pi/2N$ are generated, for example. In this case also, the noise property is expected to be improved as compared to the first embodiment.

As described above, the duty adjusting circuit 34 generates the N local signals with the duty of 1/N of which phases are different from each other by $2\pi/N$ to input to the mixers 33-1 to 33-N, and the mixers 33-1 to 33-N frequency-convert the input signal based on the local signal to output to the adder 35. Then, the adder is configured to add up the signals output from the mixers 33-1 to 33-N; Therefore, it is possible to improve the noise property as compared to the first embodiment while suppressing the N-th harmonic of the local signal.

Third Embodiment

Figure 8:
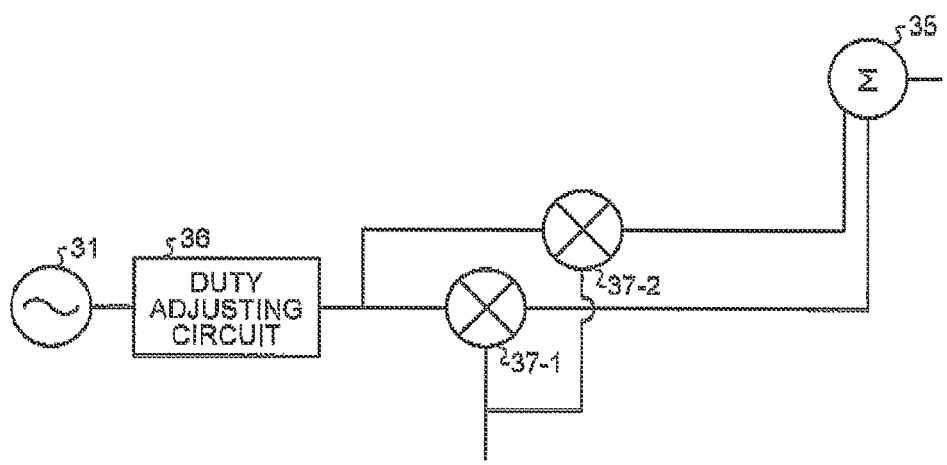
FIG. 8 is a view of a functional configuration example of the frequency converting device according to a third embodiment.

FIG. 8 is a view of a functional configuration example of the frequency converting device according to a third embodiment. The frequency converting device of this embodiment is composed of the oscillator 31, a duty adjusting circuit 36, mixers 37-1 to 37-2, and the adder 35. A reference numeral identical to that of the first or second embodiment is assigned to a component having a similar function as that of the first or second embodiment and an overlapping description is omitted. Hereinafter, a point different from that of the first or second embodiment is described.

In this embodiment, the duty adjusting circuit 36 generates two local signals with the duty of 1/N (N is the integral number not smaller than 3) of which phases are different from each other by $\pi/m$ (M is an integral number not smaller than 2, M≠N) to input to the mixers 37-1 and 37-2, respectively.

Figure 9:
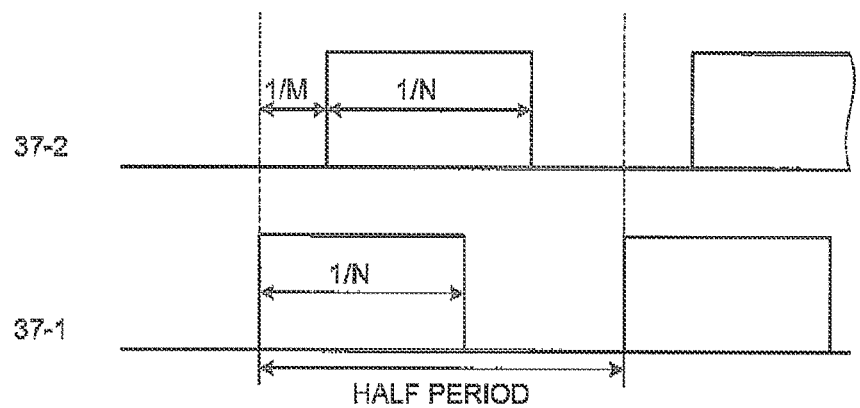
FIG. 9 is a view of an example of the local signal with the duty of 1/N generated by the duty adjusting circuit of a third embodiment.

FIG. 9 is a view of an example of the local signal with the duty of 1/N generated by the duty adjusting circuit 36 of this embodiment. For example, the local signal to be input to the lowest mixer 37-1 in FIG. 9 and the local signal to be input to the second lowest mixer 37-2 in FIG. 9 are shifted from each other by 1/M of half a period. That is to say, the phases thereof are shifted from each other by $\pi/M$. The duty adjusting circuit 36 of this embodiment generates the local signals of which phases are shifted from each other by $\pi/M$ in this manner.

By using the two local signals of which phases are different from each other by $\pi/M$, an M-th harmonic of the local signal may be suppressed. For example, regardless of a value of N, the local signal f(t) with the duty of 1/N may be expressed by a following equation (6), in general.

$$f(t) = c_0 + c_1 \sin\omega_0 t + c_2 \sin 2\omega_0 t + c_3 \sin 3\omega_0 t + \ldots \quad (6)$$

$$= c_0 + \sum c_n \sin(n\omega_0 t)$$

A local signal $f(t-T/(2M))$ of which phase is shifted by $\pi/M$ relative to f(t) may be expressed by a following equation (7).

Meanwhile, Σ in the equation (7) represents a sum from n=1 to ∞.

$$f(t-T/(2M)) = c_0 + \Sigma c_n (\sin n\omega_0(t-T/(2M))) \quad (7)$$

Therefore, when M is set to satisfy $n\omega_0 T/(2m)=\pi$, absolute values of n-th harmonic components of f(t) and $f(t-T/(2m))$ are equal to each other and signs thereof are opposite, so that the n-th harmonic component is deleted when f(t) and $f(t-T/(2M))$ are added up. That is to say, when the frequency conversion is performed using the two local signals, by adding up the two signals after the frequency conversion, an effect by the n-th harmonic component is suppressed. Since $\omega_0=2\pi/T$, a deleted order n=M. That is to say, by generating the identical local signals of which phases are different from each other by $\pi/M$, an M-th harmonic component of the local signal may be suppressed.

In this manner, the local signals with the duty of 1/N of which phases are different from each other by $\pi/M$ are used in this embodiment, so that both of the N-th harmonic component and the M-th harmonic component may be suppressed. For example, when N=3 and M=2, both of the second and third harmonic components may be suppressed.

Meanwhile, in this embodiment, although the number of the mixers are set to 2 (mixers 37-1 and 37-2) and the two local signals are generated in order to make the description simple in the above-description, the number of mixers K may be 2 or larger and it may be configured that the local signal is generated for each mixer.

As described above, this embodiment is provided with the mixers 37-1 and 37-2 and the duty adjusting circuit 36 is configured to input the local signals with the duty of 1/N of which phases are different from each other by $\pi/M$ to the mixers 37-1 and 37-2. Therefore, both of the N-th harmonic component and the M-th harmonic component of the local signal may be suppressed.

Fourth Embodiment

FIG. 10 is a view of a functional configuration example of the frequency converting device according to a fourth embodiment. The frequency converting device of this embodiment is composed of the oscillator 31, mixer units 39-1 and 39-2, and the adder 35. A reference numeral identical to that of the first or second embodiment is assigned to a component having a similar function as that of the first or second embodiment and an overlapping description is omitted. Hereinafter, a point different from that of the first, second or third embodiment is described.

Each of the mixer units 39-1 and 39-2 is composed of the mixers 33-1 to 33-N. In this embodiment, although the duty adjusting circuit 38 generates the N local signals with the duty of 1/N of which phases are different from each other by $2\pi/N$ to input to the mixers 33-1 to 33-N, respectively, as in the second embodiment, this generates the local signals such that there is phase difference by $\pi/M$ between the local signal to be input to the mixer unit 39-1 and the local signal to be input to the mixer unit 39-2. For example, the phase difference between the local signal to be input to the mixer 33-1 of the mixer unit 39-2 and the local signal to be input to the mixer 33-1 of the mixer unit 39-1 is $\pi/M$ and the phase difference between the local signal to be input to the mixer 33-2 of the mixer unit 39-1 and the local signal to be input to the mixer 33-2 of the mixer unit 39-2 is $\pi/M$.

Then, all the signals output from the mixers 33-1 to 33-N of the mixer units 39-1 and 39-2 are added up by the adder 35. Therefore, in this embodiment, both of the effects of the second and third embodiments may be obtained.

Meanwhile, although the mixer units 39-1 and 39-2 are provided and each of the mixer units 39-1 and 39-2 is composed of the mixers 33-1 and 33-N in the example illustrated in FIG. 10, this may be opposite and N mixer units composed of the mixers 37-1 and 37-2 similar to those of the third embodiment may be provided. In this case, the phase difference between the local signals to be input to the mixers 37-1 and 37-2 is set to $\pi/M$, the local signals input to the mixer 37-1 of each of the mixer units are such that the phases thereof are different from each other by $2\pi/N$, and the local signals to be input to the mixer 37-2 of each of the mixer units are such that the phases thereof are different from each other by $2\pi/N$.

As described above, in this embodiment, the mixer units 39-1 and 39-2 composed of the mixers 33-1 to 33-N of the second embodiment are provided, the duty adjusting circuit 38 is configured to generate the N local signals with the duty of 1/N of which phases are different from each other by $2\pi/N$ to input to the mixers 33-1 to 33-N, and to generate the local signals such that there is the phase difference of $\pi/M$ between the local signal to be input to the mixer unit 39-1 and the local signal to be input to the mixer unit 39-2. Therefore, both of the N-th harmonic component and the M-th harmonic component of the local signal may be suppressed and the noise property may be improved as compared to that of the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A frequency converting device, comprising:
   a duty adjusting unit that generates a 1/N local signal being a local signal with a duty ratio of 1/N when N is an integral number not smaller than 3 and an N-th high-frequency component included in the local signal is a target of inhibition;
   N mixers that output a difference or a sum between/of the 1/N local signal and an input signal; and
   an adder that adds up outputs from the N mixers, wherein the duty adjusting unit generates N 1/N local signals of which phases are different from each other by $2\pi/N$ and inputs the generated 1/N local signals to the mixers different from each other.

2. A frequency converting method in a frequency converting device, comprising:
   generating a 1/N local signal being a local signal with a duty ratio of 1/N when N is an integral number not smaller than 3 and an N-th high-frequency component included in the local signal is a target of inhibition; and
   outputting difference or sum between/of the 1/N local signal and an input signal, wherein
   the frequency converting device comprises N mixers that output the difference or sum between/of the 1/N local signal and the input signal, generates N 1/N local signals of which phases are different from each other by $2\pi/N$ and inputs the generated 1/N local signals to the mixers different from each other, and adds up outputs from the N mixers.

3. The frequency converting method according to claim 2, wherein
   the frequency converting device composes a first mixer unit of the N mixers and further comprises a second mixer unit composed of the N mixers,
   inputs the generated N 1/N local signals to the mixers different from each other of the mixers composing the first mixer unit as N first 1/N local signals, further generates N second 1/N local signals of which phases are different from each other by $2\pi/N$ and of which phase is different from the phase of the corresponding first 1/N local signal by $\pi/M$ and inputs the second 1/N local signals to the mixers different from each other of the mixers composing the second mixer unit, and
   adds up outputs from the N mixers composing the first mixer unit and outputs from the N mixers composing the second mixer unit.

* * * * *